United States Patent [19]

Miyashita et al.

[11] Patent Number: 4,673,892

[45] Date of Patent: Jun. 16, 1987

[54] PHASE LOCKED LOOP FREQUENCY SYNTHESIZER WITH BATTERY SAVING CIRCUIT

[75] Inventors: Hideo Miyashita; Shigeo Yoshihara, both of Tokyo, Japan

[73] Assignee: NEC Corporation, Japan

[21] Appl. No.: 860,655

[22] Filed: May 7, 1986

[30] Foreign Application Priority Data

May 13, 1985 [JP] Japan .................................. 60-99479

[51] Int. Cl.$^4$ .............................................. H03L 7/18
[52] U.S. Cl. ...................................... 331/14; 331/16; 331/17; 331/25; 455/343
[58] Field of Search ..................... 331/14, 16, 17, 25; 455/343

[56] References Cited

U.S. PATENT DOCUMENTS 4,521,918  6/1985  Challen ............................. 331/14 X

FOREIGN PATENT DOCUMENTS

| 1591621 | 2/1971 | Fed. Rep. of Germany | 331/14 |
| 56-136037 | 10/1981 | Japan | 331/14 |
| 58-66434 | 4/1983 | Japan | 331/14 |
| 60-55729 | 4/1985 | Japan | 331/14 |

Primary Examiner—Siegfried H. Grimm
Attorney, Agent, or Firm—Laff, Whitesel, Conte & Saret

[57] ABSTRACT

A frequency synthesizer applicable to a radio communication equipment includes a phase comparator adapted to produce a voltage representative of a difference in phase between outputs of a variable and a fixed frequency dividers. The output of the phase comparator is applied through a switch and a low pass filter to a voltage controlled oscillator. A reset circuit produces a reset signal interlocked with a power source of the synthesizer. The variable and the fixed frequency dividers are reset by the reset signal while the switch is closed after the generation of the reset signal and opened upon turn-off of the power source.

3 Claims, 2 Drawing Figures

PHASE LOCKED LOOP FREQUENCY SYNTHESIZER WITH BATTERY SAVING CIRCUIT

BACKGROUND OF THE INVENTION

The present invention relates to a frequency synthesizer applicable to radio communication equipment.

A prior art frequency synthesizer of the kind described includes a variable frequency divider for dividing an output frequency of a voltage controlled oscillator to a predetermined frequency, a fixed frequency divider for dividing an output frequency of a reference oscillator, and a phase comparator for comparing the phases of outputs of the two frequency dividers to produce a voltage which is representative of a difference between the two phases. The output of the phase comparator is applied to the voltage controlled oscillator to control the oscillation frequency thereof, thereby producing a desired frequency. A power source voltage is constantly applied to the voltage controlled oscillator and intermittently applied to the two frequency dividers, the phase comparator and the reference oscillator. A problem is that the prior art synthesizer needs a long lock-up time because of the intermittent power source voltage supply. Another problem is that substantial power is consumed even in a battery saving condition because a power source voltage is constantly applied to the voltage controlled oscillator.

SUMMARY OF THE INVENTION

It is therefore an object of the present invention to provide a frequency synthesizer which with a simple construction succeeds in shortening the lock-up time.

It is another object of the present invention to provide a frequency synthesizer which cuts down power consumption in a battery saving condition.

It is still another object of the present invention to provide a generally improved frequency synthesizer.

A frequency synthesizer which controls an oscillation frequency of a voltage controlled oscillator and is energized by a power source of the present invention comprises a first frequency divider for dividing an output frequency of the voltage controlled oscillator, a second frequency divider for dividing an output frequency of a reference oscillator, a phase comparator for comparing a phase of an output of the first frequency divider and an output of the second frequency divider, a voltage outputted by the phase comparator being fed back to the voltage controlled oscillator via a low-pass filter, a first switch connected between the phase comparator and the low pass filter, and a reset circuit interlocked with the power source for producing a reset signal, the reset signal from the reset circuit resetting the first and second frequency dividers, the first switch being closed after the reset signal has been produced and opened at an instant when the power source has been turned off.

The synthesizer may further comprise a second switch which is opened and closed by a battery saving control signal applied to the second switch, thereby supplying an intermittent power voltage to at least the first and second frequency dividers.

The synthesizer may further comprise a delay circuit connected to an output terminal of the second switch for controlling opening and closing of the first switch responsive to an output of the second switch.

The above and other objects, features and advantages of the present invention will become more apparent from the following detailed description taken with the accompanying drawings.

DESCRIPTION OF THE PREFERRED EMBODIMENT

While the frequency synthesizer of the present invention is susceptible of numerous physical embodiments, depending upon the environment and requirements of use, a substantial number of the herein shown and described embodiment have been made, tested and used, and all have performed in an eminently satisfactory manner.

Figure 1:
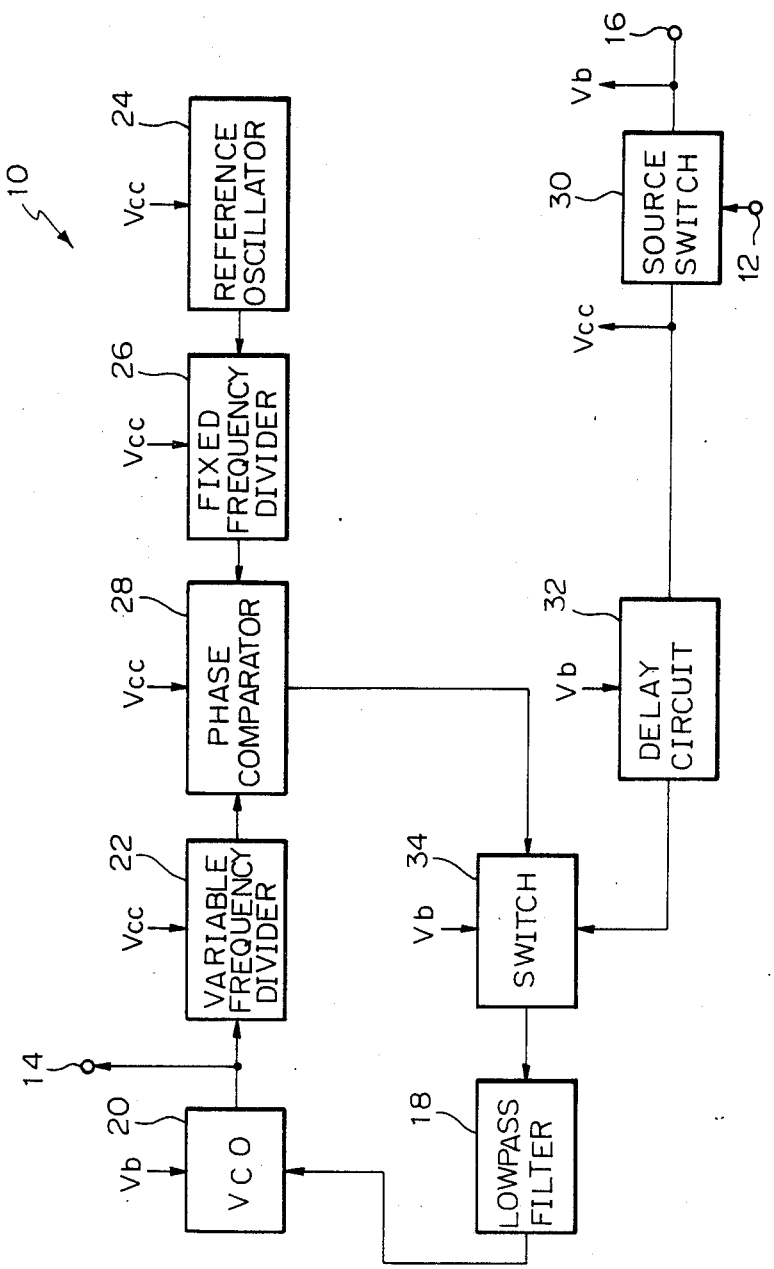
FIG. 1 is a block diagram showing a prior art frequency synthesizer.

To better understand the present invention, a brief reference will be made to a prior art frequency synthesizer, shown in Fig. 1. As shown, the frequency synthesizer, generally 10, comprises an input terminal 12 to which a battery saving control signal is applied, an output terminal 14, and a source input terminal 16 adapted to power the whole synthesizer. Source voltages $V_{cc}$ and $V_b$ are fed to the various structural elements of the synthesizer 10.

In detail, the synthesizer 10 comprises a low pass filter (LPF) 18, a voltage controlled oscillator (VCO) 20 the output frequency of which is controlled by an output of the LPF 18, a variable frequency divider 22 functioning to divide an output frequency of the VCO 20 to a predetermined frequency, a reference oscillator 24, a fixed frequency divider 26 adapted to divide the output frequency of the reference oscillator 24, and a phase comparator 28 adapted to compare the phases of the outputs of the frequency dividers 22 and 26 and produce a voltage representative of a difference therebetween. The synthesizer 10 further comprises a source switch 30 which is opened and closed by the battery saving control signal applied to the terminal 12, a delay circuit 32 connected to an output terminal of the source switch 30, and a switch 34 supplied with outputs of the phase comparator 28 and delay circuit 32 and opened and closed by the output of the delay circuit 32. When the switch 34 is closed, the output voltage of the phase comparator 28 is delivered via the LPF 18 to the VCO 20 so as to control the VCO oscillation frequency. While the switch 30 is closed, the voltage $V_{cc}$ is fed to the various elements of the synthesizer 10 is illustrated.

Under some conditions, the voltage $V_{cc}$ may be applied to only the frequency dividers 22 and 26.

In operation, the frequency produced by the reference oscillator 24 which is accurate and stable and the output frequency of the VCO 20 are individually divided and then applied to the phase comparator 28. Comparing the phases of the two input frequencies, the phase comparator 28 produces a voltage representative of a phase difference therebetween. Thus voltage is fed to the VCO 20 to control its oscillation frequency, whereby a desired frequency is attained with the accuracy of the oscillator 24.

The prior art frequency synthesizer 10 constructed and operated as described above has some drawbacks, as pointed out by the preamble of the instant specification. Namely, the lock-up time is long. In addition, because the voltage $V_b$ is constantly applied to the VCO 20, power consumption in a battery saving condition is substantial.

In light of this, in accordance with the present invention, when a source switch is closed to apply a voltage, a reset signal is fed from a reset circuit to a variable frequency divider and a fixed frequency divider. After the reset signal has been outputted, the switch is closed so that an output voltage of a phase comparator is applied to a VCO to control the oscillation frequency of the VCO. At the instant when the power switch is turned on and then off after the synthesizer has been once locked, the frequency of the VCO is substantially the same as the locked frequency. Hence, as the variable and the fixed frequency dividers are reset, the output of the phase comparator is approximated to a steady output with the result that the lock-up time is shortened.

A preferred embodiment of the present invention will be described in detail hereinafter.

Figure 2:
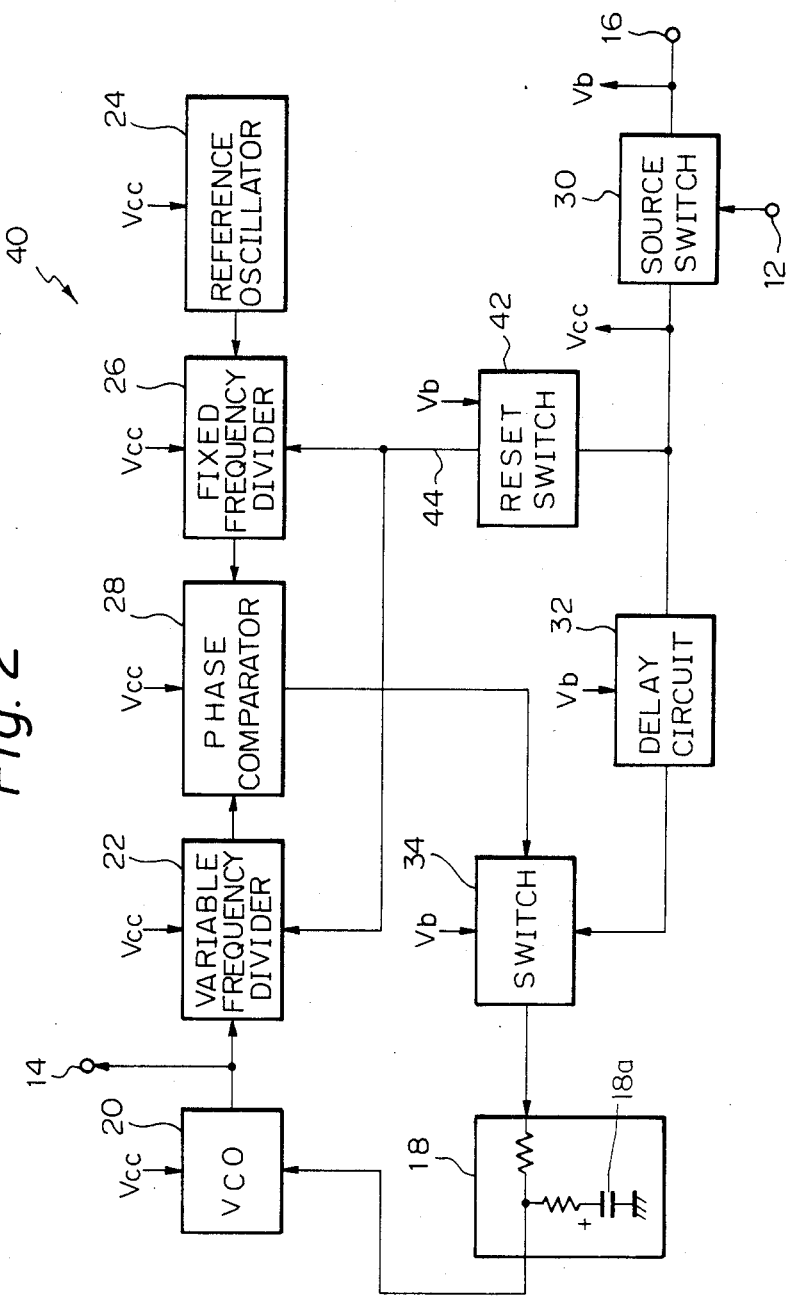
FIG. 2 is a block diagram of a frequency synthesizer embodying the present invention.

Referring to FIG. 2, a frequency synthesizer embodying the present invention is shown and generally designated by the reference numeral 40. In FIG. 2, the same structural elements as those of FIG. 1 are designated by like reference numerals. As shown, the synthesizer 40 includes, in addition to the various elements of the prior art synthesizer 10, a reset circuit 42 adapted to produce a reset signal interlockd with a power source of the synthesizer 40. The reset signal 44 is applied to a variable frequency divider 22 and a fixed frequency divider 26 to reset them.

In operation, the output frequency of a VCO 20 is divided by the variable frequency divider 22 to a predetermined frequency and, then, applied to a phase comparator 28. Meanwhile, the output frequency of a reference oscillator 24 is divided by the fixed frequency divider 26 and, then, applied to the phase comparator 28. The phase comparator 28 compares the phases of the frequency dividers 22 and 26 to produce a voltage which is representative of the resultant phase difference. A source voltage is applied to a source input terminal 16 to power the entire synthesizer 40. A battery saving control signal is fed to an input terminal 12 to turn on and off a source switch 30. While the switch 30 is turned on, a voltage $V_{cc}$ is applied to the various elements of the synthesizer 40.

Under some conditions, the voltage $V_{cc}$ may be applied to only the frequency dividers 22 and 26.

When the switch 30 has been turned on and the voltage $V_{cc}$ has been applied, the reset circuit 42 produces a reset signal for resetting the variable and the fixed frequency dividers 22 and 26. A delay circuit 32 delivers an ON signal to a switch 34 after the voltage $V_{cc}$ has been applied via the switch 30 and the reset signal 44 has been delivered from the reset circuit 42. When the switch 30 has been turned off, an OFF signal is applied to the switch 34 at the same time.

While the switch 34 is turned on, the output voltage of the phase comparator 28 is routed through a LPF 18 to the VCO 20. While the switch 34 is turned off, an output voltage of the phase comparator 28 which has appeared immediately before the turn-off of the switch 34 is held by a capacitor 18a of the LPF 18. Generally, the period of time during which the capacitor 18a holds the output voltage of the phase comparator 28 is determined by the capacitance of the capacitor 18a, the input impedance of the VCO 20, and the output impedance of the switch 34. In accordance with the present invention, the switch 34 is constructed to turn off after a period of time which is far shorter than the holding time of the capacitor 18a. While the switch 34 is turned off, the output of the phase comparator 28 is fed back to the VCO 20 via the LPF 18 so that the VCO oscillation frequency is controlled by a DC voltage which is outputted by the LPF 18.

At the instant when the switch 30 is turned off and then on after the synthesizer 40 has been once locked, the output frequency of the VCO 20 is substantially equal to the frequency which has been locked by the voltage held by the capacitor 18a. As a result, when the frequency dividers 22 and 28 are reset, the output of the phase comparator 28 is approximated to the steady output which has appeared during the locked condition, thereby shortening the lock-up time.

In summary, it will be seen that the present invention provides a frequency synthesizer which shortens lock-up time and cuts down power consumption in a battery saving condition without resorting to complicated means. Specifically, the only element needed besides those of the prior art is a reset circuit which produces a reset signal interlocked with a power source of the synthesizer so as to reset a variable and a fixed frequency divider, thereby reducing a phase difference between the outputs of the frequency dividers within a short period of time.

Various modifications will become possible for those skilled in the art after receiving the teachings of the present disclosure without departing from the scope thereof.

What is claimed is:

1. A frequency synthesizer which controls an oscillation frequency of a voltage controlled oscillator and is energized by a power source, comprising:
    a first frequency divider for dividing an output frequency of the voltage controlled oscillator;
    a second frequency divider for dividing an output frequency of a reference oscillator;
    a phase comparator for comparing a phase of an output of said first frequency divider and an output of said second frequency divider, a voltage outputted by said phase comparator being fed back to the voltage controlled oscillator via a low-pass filter;
    a first switch connected between said phase comparator and said low pass filter; and
    a reset circuit interlocked with the power source for producing a reset signal;
    said reset signal from said reset circuit resetting said first and second frequency dividers, said first switch being closed after the reset signal has been produced and opened at an instant when the power source has been turned off.

2. A frequency synthesizer as claimed in claim 1, further comprising a power source switch which is opened and closed by a battery saving control signal applied to said power source switch, thereby supplying an intermittent power voltage to at least the first and second frequency dividers.

3. A frequency synthesizer as claimed in claim 2, further comprising a delay circuit connected to an output terminal of said power source switch for controlling opening and closing of said first switch responsive to an output of said power source switch.

* * * * *